United States Patent
Liu et al.

(10) Patent No.: US 9,142,517 B2
(45) Date of Patent: Sep. 22, 2015

(54) HYBRID BONDING MECHANISMS FOR SEMICONDUCTOR WAFERS

(71) Applicant: TAIWAN SEMICONDUCTOR MANUFACTURING COMPANY, LTD., Hsinchu (TW)

(72) Inventors: Ping-Yin Liu, Yonghe (TW); Szu-Ying Chen, Toufen Township (TW); Chen-Jong Wang, Hsinchu (TW); Chih-Hui Huang, Yongkang (TW); Xin-Hua Huang, Xihu Township (TW); Lan-Lin Chao, Sindian (TW); Yeur-Luen Tu, Taichung (TW); Chia-Chiung Tsai, Hsinchu (TW); Xiaomeng Chen, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 13/664,796

(22) Filed: Oct. 31, 2012

(65) Prior Publication Data

US 2014/0117546 A1    May 1, 2014

(51) Int. Cl.
*H01L 23/00* (2006.01)
*H01L 23/532* (2006.01)
*H01L 21/768* (2006.01)
*H01L 25/00* (2006.01)
*H01L 25/065* (2006.01)

(52) U.S. Cl.
CPC .......... *H01L 24/03* (2013.01); *H01L 21/76831* (2013.01); *H01L 21/76834* (2013.01); *H01L 23/53238* (2013.01); *H01L 23/53295* (2013.01); *H01L 24/05* (2013.01); *H01L 24/08* (2013.01); *H01L 24/80* (2013.01); *H01L 25/0657* (2013.01); *H01L 25/50* (2013.01); *H01L 2224/0345* (2013.01); *H01L 2224/0346* (2013.01); *H01L 2224/0347* (2013.01); *H01L 2224/0348* (2013.01); *H01L 2224/0361* (2013.01); *H01L 2224/03616* (2013.01); *H01L 2224/05026* (2013.01); *H01L 2224/05147* (2013.01); *H01L 2224/05187* (2013.01); *H01L 2224/05553* (2013.01); *H01L 2224/05564* (2013.01); *H01L 2224/05571* (2013.01); *H01L 2224/05576* (2013.01); *H01L 2224/05578* (2013.01); *H01L 2224/05647* (2013.01); *H01L 2224/05687* (2013.01); *H01L 2224/08121* (2013.01); *H01L 2224/08147* (2013.01); *H01L 2224/80121* (2013.01); *H01L 2224/80203* (2013.01); *H01L 2225/06513* (2013.01); *H01L 2924/00014* (2013.01)

(58) Field of Classification Search
None
See application file for complete search history.

(56) References Cited

U.S. PATENT DOCUMENTS

| | | | | |
|---|---|---|---|---|
| 2004/0245634 | A1* | 12/2004 | Kloster et al. | 257/750 |
| 2008/0142991 | A1* | 6/2008 | Wong et al. | 257/777 |
| 2011/0291267 | A1* | 12/2011 | Wang et al. | 257/737 |
| 2012/0068355 | A1* | 3/2012 | Aoki et al. | 257/774 |

* cited by examiner

*Primary Examiner* — Steven Loke
*Assistant Examiner* — Juanita B Rhodes
(74) *Attorney, Agent, or Firm* — Lowe Hauptman & Ham, LLP (57) ABSTRACT

The embodiments of diffusion barrier layer described above provide mechanisms for forming a copper diffusion barrier layer to prevent device degradation for hybrid bonding of wafers. The diffusion barrier layer(s) encircles the copper-containing conductive pads used for hybrid bonding. The diffusion barrier layer can be on one of the two bonding wafers or on both bonding wafers.

17 Claims, 11 Drawing Sheets

HYBRID BONDING MECHANISMS FOR SEMICONDUCTOR WAFERS

CROSS-REFERENCE TO RELATED APPLICATIONS

This application is related to the following co-pending and commonly assigned patent applications: U.S. Ser. No. 13/488,745, filed on Jun. 5, 2012, entitled, "Three Dimensional Integrated Circuit Structures and Hybrid Bonding Methods for Semiconductor Wafers", and U.S. Ser. No. 13/542,507, filed on Jul. 5, 2012, entitled "Hybrid Bonding Systems and Methods for Semiconductor Wafers". Both above-mentioned patent applications are incorporated herein by reference in their entireties.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

Three dimensional integrated circuits (3DICs) are a recent development in semiconductor packaging in which multiple semiconductor dies are stacked upon one another, such as package-on-package (PoP) and system-in-package (SiP) packaging techniques. Some 3DICs are prepared by placing dies over dies on a wafer level. 3DICs provide improved integration density and other advantages, such as faster speeds and higher bandwidth, because of the decreased length of interconnects between the stacked dies, as examples. However, there are many challenges related to 3DICs.

BRIEF DESCRIPTION OF THE DRAWINGS

For a more complete understanding of the present disclosure, and the advantages thereof, reference is now made to the following descriptions taken in conjunction with the accompanying drawings, in which.

The figures illustrate aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Hybrid bonding is one type of bonding procedure for 3DICs, wherein two semiconductor wafers are bonded together using a hybrid bonding technique. Some methods and structures of 3DICs formed by hybrid bonding are described in patent applications: U.S. Ser. No. 13/488,745, filed on Jun. 5, 2012, entitled, "Three Dimensional Integrated Circuit Structures and Hybrid Bonding Methods for Semiconductor Wafers", and U.S. Ser. No. 13/542,507, filed on Jul. 5, 2012, entitled "Hybrid Bonding Systems and Methods for Semiconductor Wafers". Both above-mentioned patent applications are incorporated herein by reference in their entireties.

Figure 1:
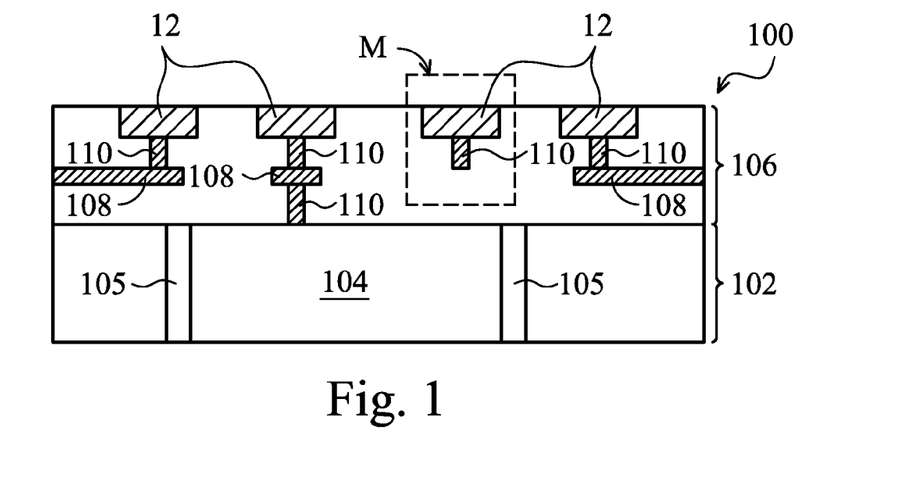
FIG. 1 is a cross-sectional view of a portion of a semiconductor wafer in accordance with an embodiment of the present disclosure.

Referring to FIG. 1, a cross-sectional view of a portion of a semiconductor wafer 100 is shown in accordance with some embodiments. Two or more semiconductor wafers similar to wafer 100 illustrated may be coupled together vertically to form a 3DIC structure. The semiconductor wafer 100 includes a workpiece 102. The workpiece 102 includes a semiconductor substrate comprising silicon or other semiconductor materials and may be covered by an insulating layer, for example. The workpiece 102 may include silicon oxide over single-crystal silicon, for example Compound semiconductors, GaAs, InP, Si/Ge, or SiC, as examples, may be used in place of silicon. The workpiece 102 may include a silicon-on-insulator (SOI) or a germanium-on-insulator (GOI) substrate, as examples.

The workpiece 102 may include a device region 104 formed proximate a top surface of the workpiece 102. The device region 104 includes active components or circuits, such as conductive features, implantation regions, resistors, capacitors and other semiconductor elements, e.g., transistors, diodes, etc. The device region 104 is formed over the workpiece 102 in a front-end-of-line (FEOL) process in some embodiments, for example. The workpiece 102 includes through-substrate vias (TSVs) 105 filled with a conductive material that provide connections from a bottom side to a top side of the workpiece 102, as shown in accordance with some embodiments.

A metallization structure 106 is formed over the workpiece 102, e.g., over the device region 104 of the workpiece 102. The metallization structure 106 is formed over the workpiece 102 in a back-end-of-line (BEOL) process in some embodiments, for example. The metallization structure 106 includes conductive features, such as conductive lines 108, vias 110, and conductive pads 112 formed in an insulating material 114, which is a dielectric material. In some embodiments, the insulating material 114 is made of silicon oxide. In some embodiments, the insulating material 114 include multiple dielectric layers of dielectric materials. One or more of the multiple dielectric layers are made of low dielectric constant (low-k) material(s). In some embodiments, a top dielectric layer of the multiple dielectric layer is made of $SiO_2$. The conductive pads 112 are contact pads or bond pads formed on a top surface of the semiconductor wafer 100, as shown in FIG. 1. Some vias 110 couple conductive pads 112 to conductive lines 108 in the metallization structure 106, and other vias 110, along with conductive metal lines 108, couple conductive pads 112 to the device region 104 of the workpiece 102. Vias 110 may also connect conductive lines 108 together in different metallization layers (not shown). The conductive features may include conductive materials typically used in BEOL processes, such as Cu, Al, W, Ti, TiN, Ta, TaN, or multiple layers or combinations thereof.

In accordance with an embodiment, the conductive pads 112 are disposed proximate a top surface of the metallization structure 106 comprising Cu or a copper alloy, which is insulated from the insulating material 114 by a diffusion barrier (not shown). The metallization structure 106 may also include interconnect structures. The metallization structure 106 shown is merely for illustrative purposes. The metallization structure 106 may comprise other configurations and may include one or more conductive line and via layers, for example. Some semiconductor wafers 100 may have three conductive line and via layers, or four or more conductive line and via layers, as other examples.

As mentioned above, two or more semiconductor wafers similar to wafer 100 illustrated are coupled together vertically to form a 3DIC structure. The semiconductor wafer 100 includes a workpiece 102. Region M of FIG. 1 will be used to illustrate various embodiments of hybrid bonding mechanisms. Region M includes a conductive pad 112 disposed above a via 110. The conductive pad 112 and the via 110 are surrounded by an insulating material 114.

Figure 2A:
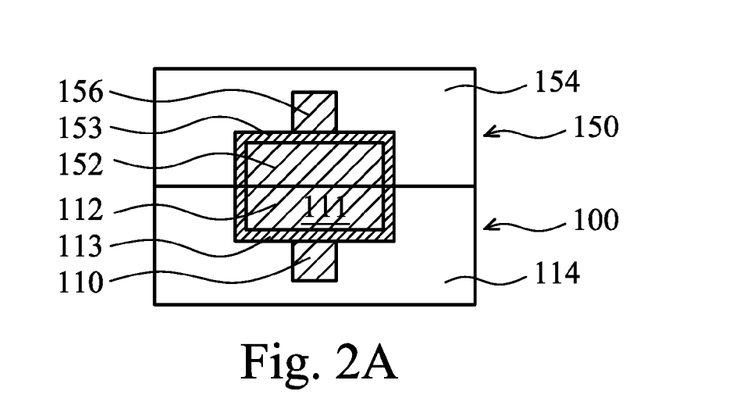
FIG. 2A shows a cross-sectional view of a bonded structure in accordance with some embodiments.

FIG. 2A shows a cross-sectional view of a bonded structure in accordance with some embodiments. The bonded structure is near region M of wafer 100. As described above, region M includes a conductive pad 112 disposed above a via 110. The conductive pad 112 and the via 110 are surrounded by an insulating material 114. The conductive pad 112 is filled with copper or copper alloy. According to one or more embodiments, the insulating material 114 is made of $SiO_2$. FIG. 2A shows that conductive pads 112 and 152 are bonded to each and insulating materials 114 and 154 are bonded to each other, forming the bonded structure. Since the bonding involves dielectric material to dielectric material, and conductive material to conductive material, the wafer to wafer bonding is a hybrid bonding.

Due to the concern of copper diffusion in $SiO_2$, a barrier layer 113 is deposited to line the opening 111. The opening 111 is filled to form conductive pad 112. The barrier layer 113 separates the copper-containing conductive pad 112 from the insulating material 114. According to one or more embodiments, the barrier layer 113 is made of a copper diffusion barrier material. In some embodiments, barrier layer 113 is made of TaN. In some embodiments, barrier layer 113 has thickness in a range from about 10 Å to about 1000 Å.

FIG. 2A shows that wafer 100 is bonded to wafer 150 with conductive pad 112 of wafer 100 being bonded to a conductive pad 152 of wafer 150. Conductive pad 152 is also made of copper or copper alloy. A barrier layer 153 is also used to separate conductive pad 152 from insulating material 154, which surrounds conductive pad 152 and via 156. The bonding of wafers 100 and 150 involves aligning the structures, such as conductive pads 112, and 152, on these two wafers to have conductive regions bonded to conductive regions, such as conductive pad 112 bonded to pad 152, and insulator regions bonded to insulator regions, such as insulating material 114 to insulating material 154. After wafer alignment, the wafers 100 and 150 are pressed together and temperature is raised to allow bonds to be formed between conductive layers and between insulating layers of these wafers. As mentioned above, detailed description of hybrid bonding is described in patent applications: U.S. Ser. No. 13/488,745, filed on Jun. 5, 2012, entitled, "Three Dimensional Integrated Circuit Structures and Hybrid Bonding Methods for Semiconductor Wafers", and U.S. Ser. No. 13/542,507, filed on Jul. 5, 2012, entitled "Hybrid Bonding Systems and Methods for Semiconductor Wafers". Both above-mentioned patent applications are incorporated herein by reference in their entireties.

FIG. 2A shows that the surface of conductive pad 152 matches the surface conductive pad 112 and the copper-containing material(s) in both conductive pad 112 and 152 are enclosed by barrier layers 113 and 153. Conductive pads 112 and 152 do not come in contact with insulating materials 114 and 154.

Figure 2B:
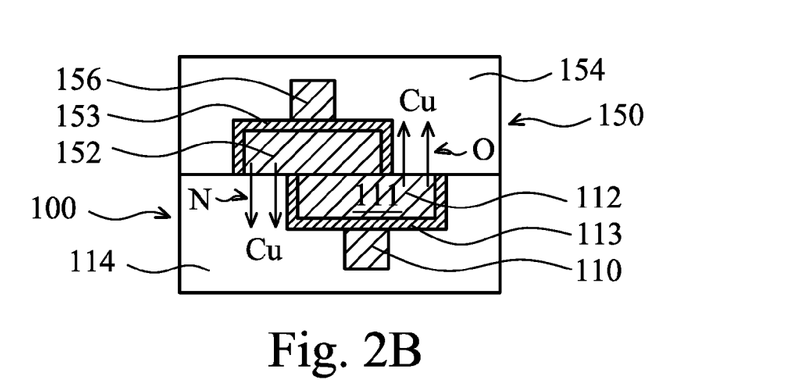
FIG. 2B shows a cross-sectional view of a bonded structure with a mis-alignment, in accordance with some embodiments.

However, the alignment of wafer 100 to wafer 150 could be offset due to process variation. FIG. 2B a bonding structure similar to FIG. 2A with a misalignment of the bonding structure, in accordance with some embodiments. FIG. 2B shows that conductive pad 112 is shifted slightly in one direction (e.g., to the right) relative to conductive pad 152 due to alignment and/or process variations. As a result, portion of conductive pad 152 is exposed to insulating material 114 in region N and portion of conductive 112 is exposed to insulating material 154 in region O. Such exposure would result in copper diffusion, which could degrade device performance.

Figure 3:
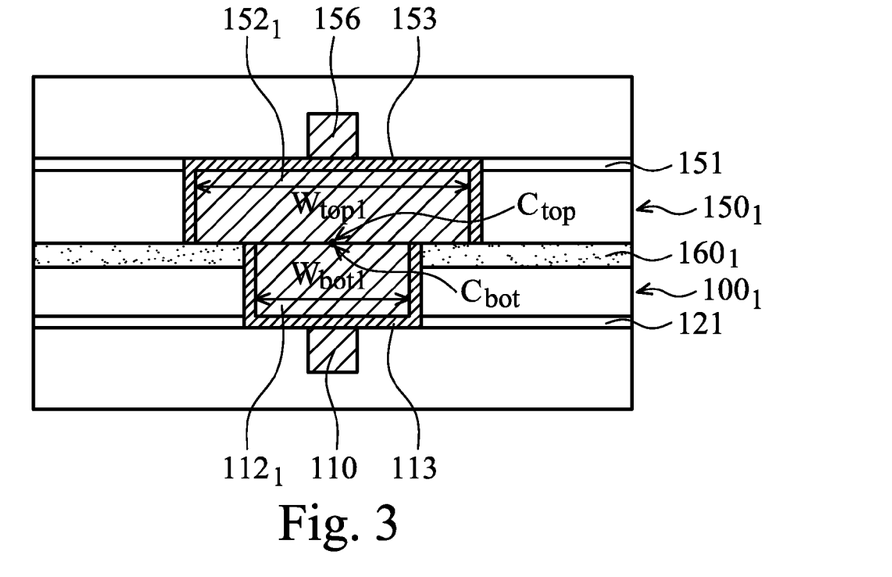
FIG. 3 shows a cross-sectional view of a bonded structure, in accordance with some embodiments.

FIG. 3 shows a cross-sectional view of a region of wafer $150_1$ being bonded to wafer $100_1$, in accordance with some embodiments. FIG. 3 shows the width $W_{top1}$ of conductive pad $152_1$ is larger than the width $W_{bot1}$ of conductive pad $112_1$. Although a center $C_{top}$ of conductive pad $152_1$ is aligned with a center $C_{bot}$ of conductive pad $112_1$ in FIG. 3, misalignment can occur due to alignment and/or process variation(s). To prevent copper diffusion, a diffusion barrier layer $160_1$ is formed on a surface of wafer $100_1$ and encircles a top portion of the conductive pad $112_1$. FIG. 3 shows that the diffusion barrier layer $160_1$ separates a surface of conductive pad $152_1$ not covered by conductive pad $112_1$ from the insulating material 114 to prevent copper diffusion.

The diffusion barrier layer $160_1$ may be made of any type of material that blocks the diffusion of copper, such as SiN, SiON, TaN, TiN, AlN, etc. In some embodiments, diffusion barrier layer $160_1$ is made of polymers, such as benzocyclobutene (BCB) polymer dielectric, which can block copper diffusion. The materials for the function of copper diffusion barrier described above may be conductive, such as TaN, TiN, and AlN, or dielectric, such as SiN and SiON. For the embodiments shown in FIG. 3, the diffusion barrier layer $160_1$ should be dielectric to prevent shorting between neighboring conductive features. The diffusion barrier layer $160_1$ is bonded to the insulating material 154. The diffusion barrier layer used, such as layer $160_1$, should bond with the material on the other wafer. For example, diffusion barrier layer $160_1$ should bond with insulating material 154. SiN or SiON bonds with $SiO_2$, which can be used of insulating material 154. TaN, TiN, and AlN also bond with $SiO_2$. FIG. 3 also show an optional etch stop layer 121 in wafer $100_1$ and an optional etch stop layer 151 in wafer $150_1$.

Since the diffusion barrier layer $160_1$ is only formed on wafer $100_1$, whose conductive pad $112_1$ is smaller than the opposing conductive pad $152_1$, there is a risk of copper diffusion if a portion of the smaller conductive pad $112_1$ is shifted to be outside a boundary of conductive pad $152_1$ due to mis-alignment. For a perfect alignment, the center $C_{bot}$ of conductive pad $112_1$ is aligned with the center $C_{top}$ of conductive pad $152_1$, as shown in FIG. 3. A distance from an edge to center of conductive pad $152_1$ is $W_{top1}/2$. A distance from an edge to center of conductive pad $112_1$ is $W_{bot1}/2$. If either of the wafers $100_1$ or $150_1$ shift by an amount greater than $W_{top1}/2 - W_{bot1}/2$, a portion of conductive pad $112_1$ is shifted to be outside the boundary of conductive pad $152_1$, which would result in copper diffusion. Therefore, $W_{top1}/2 - W_{bot1}/2$ should be greater than the alignment control limit. In some embodiments, $W_{top1}/2 - W_{bot1}/2$ is greater than about 0.01 μm. In some embodiments, a diffusion barrier layer similar to diffusion barrier layer $160_1$ is also formed on the surface of wafer $150_1$. In such embodiments, diffusion barrier layer $160_1$ of wafer $100_1$ is bonded to another diffusion barrier layer on wafer $150_1$.

Figure 4A:
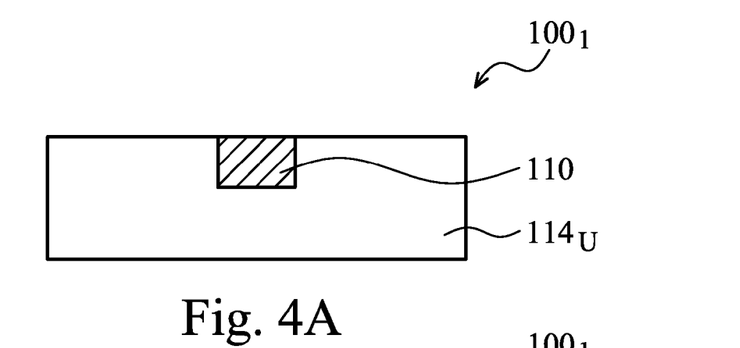
FIGS. 4A-4E show cross-sectional views of a sequential process flow for forming a diffusion barrier layer encircling a top portion of a conductive pad, in accordance with some embodiments.
Figure 4B:
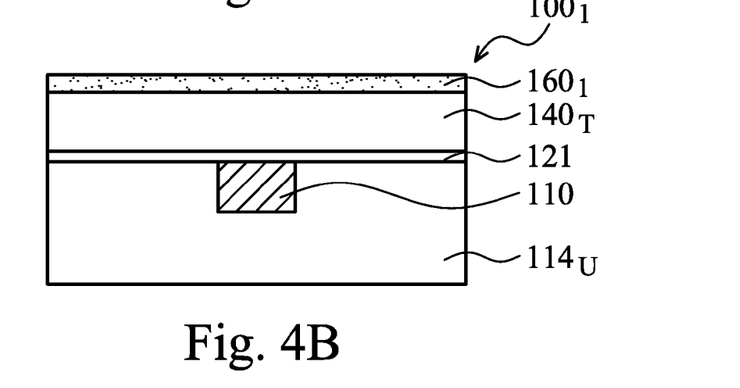

FIGS. 4A-4E show cross-sectional views of a sequential process flow for forming a diffusion barrier layer $160_1$ over the surface of wafer $100_1$ and encircling the top portion of the conductive pad $112_1$, in accordance with some embodiments. FIG. 4A shows a portion of wafer $100_1$ with a via 110, which is embedded in a dielectric material $114_L$. As described above in FIG. 1, device region 104, TSVs 105, and other interconnection layers have been formed. To keep the description simplified, only via 110 is shown in FIG. 4A. After wafer $100_1$ of FIG. 4A is provided, an etch stop layer 121, a dielectric material (or layer) $114_T$, and a protective layer $160_1$ are sequentially deposited over the surface of wafer $100_1$, as shown in FIG. 4B in accordance with some embodiments. The etch stop layer 121 is a dielectric film and is used as an etch stop during an etching process for patterning an opening 111 of conductive pad $112_1$. In some embodiments, the etch stop layer 121 is made of SiC with a thickness in a range from about 10 Å to about 5000 Å. In some embodiments, the insulating material $114_T$ is made of $SiO_2$ with a thickness in a range from about 50 Å to about 10,000 Å. The protective layer $160_1$ is made of SiN or SiON with a thickness in a range from about 5 Å to about 1000 Å, in accordance with some embodiments.

Figure 4C:
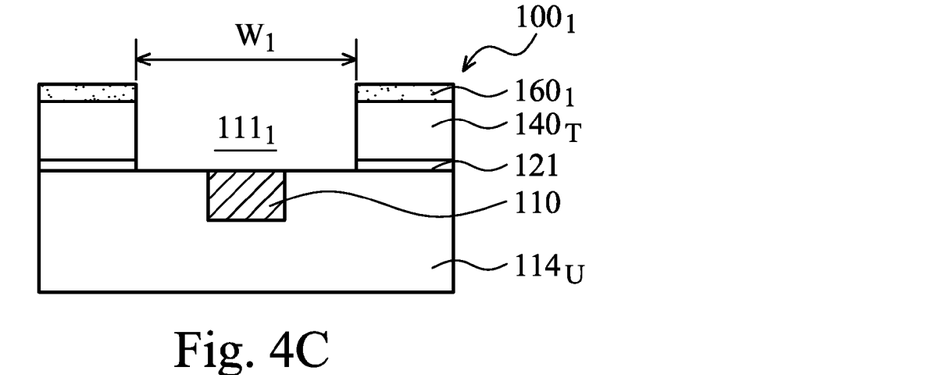
Figure 4D:
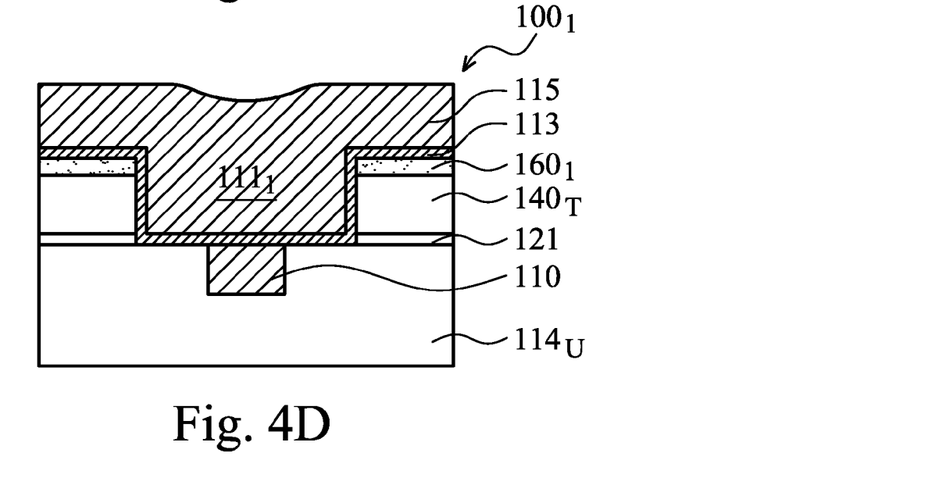

After the dielectric layers 121, $114_T$ and $160_1$ are deposited, wafer $100_1$ is patterned and etched to form opening $111_1$, as shown in FIG. 4C in accordance with some embodiments. Opening $111_1$ has a width $W_1$ in a range from about 0.1 μm to about 50 μm, in accordance with some embodiments. Opening $111_1$ exposes a top of via 110. After opening $111_1$ is formed, a barrier layer 113 is deposited to line opening $111_1$ and a conductive material 115, such as copper or copper alloy, for conductive pad $112_1$ is deposited to fill opening $111_1$. In some embodiments, the barrier layer 113 is made of TaN with a thickness in a range from about 50 Å to about 1000 Å. The TaN may be formed by physical vapor deposition (PVD) or other applicable methods. A thin copper seed layer (not shown) may be deposited on the barrier layer 113 to assist the formation of the conductive material (layer) of conductive pad $112_1$. The thin copper seed layer is deposited by PVD with a thickness in a range from about 10 Å to about 500 Å. The copper-containing conductive material 115 for pad $112_1$ is then deposited to fill opening $111_1$, as shown in FIG. 4D in accordance with some embodiments. The copper-containing conductive material 115 for pad $112_1$ is deposited by a plating process, in accordance with some embodiments. The copper seed layer is not shown in FIG. 4D because the copper seed layer merges with the copper-containing conductive material 115 that fills opening $111_1$.

Figure 4E:
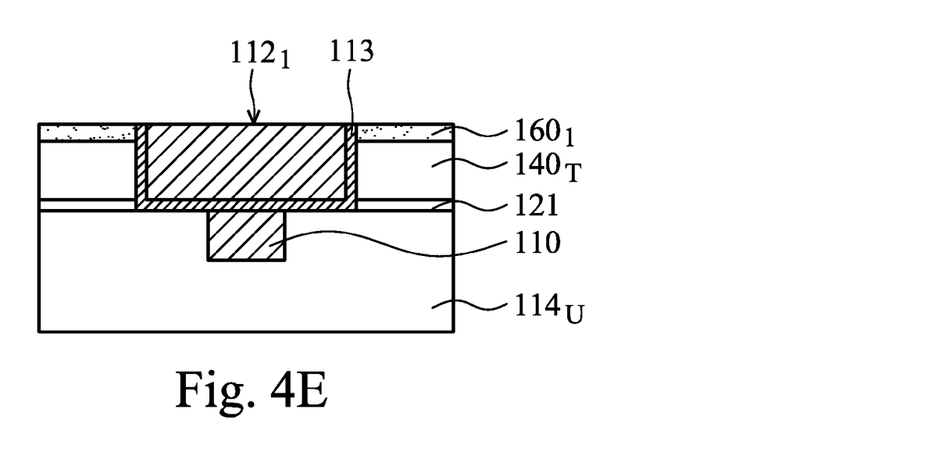

The copper-containing conductive material 115 and barrier layer 113 outside opening $111_1$ is then removed, such as by a chemical-mechanical polishing process, or an etching process. FIG. 4E shows a cross-sectional view of wafer $100_1$ after the removal process, in accordance with some embodiment. FIG. 4E shows that diffusion barrier layer $160_1$ is exposed after the removal process. The diffusion barrier layer $160_1$ can block diffusive copper, from wafer $150_1$ as described above, from reaching the device region (not shown) in wafer $100_1$.

Figure 5A:
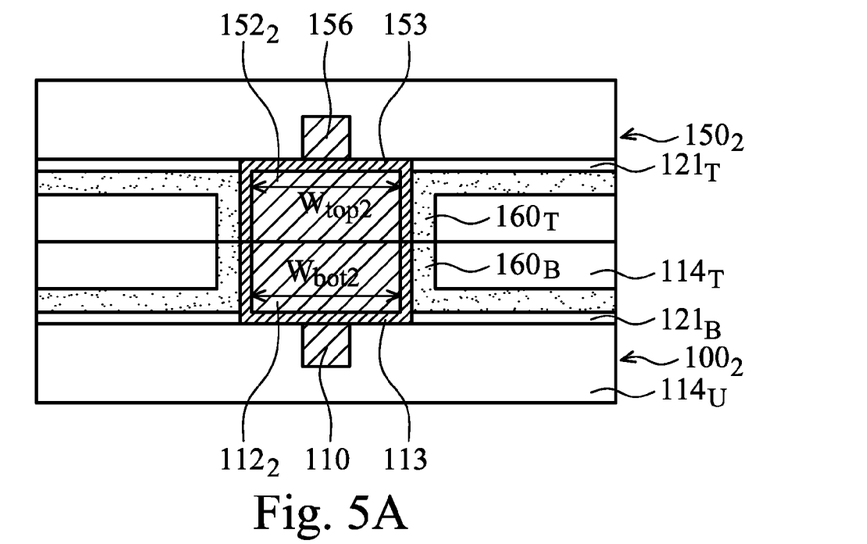
FIGS. 5A and 5B show cross-sectional views of two wafers bonded together, in accordance with some embodiments.

FIG. 5A shows a cross-sectional view of wafer $150_2$ being bonded to wafer $100_2$, in accordance with some embodiments. FIG. 5A shows the width $W_{top2}$ of conductive pad $152_2$ is about the same as the width $W_{bot2}$ of conductive pad $112_2$. Diffusion barrier layer $160_T$ is formed on wafer $150_2$ and diffusion barrier layer $160_B$ is formed on wafer $100_2$. Diffusion barrier layer $160_B$ encircles and surrounds the conductive pad $112_2$. A portion of diffusion barrier layer $160_B$ is deposited next to the etching stop layer $121_B$. Diffusion barrier layer $160_T$ also encircles and surrounds the conductive pad $152_2$. A portion of diffusion barrier layer $160_T$ is deposited next to the etching stop layer $121_T$. The diffusion barrier layers $160_T$ and $160_B$ are dielectric and may be made of materials chosen from the list of materials described for diffusion barrier layer $160_1$.

Diffusion barrier layers $160_T$ and $160_B$ prevent copper diffusion resulting from misalignment of conductive pads $112_2$ and $152_2$. The thickness T of the diffusion barrier layer should be large enough to cover alignment variation. In some embodiments, the thickness T is greater than about 0.01 μm, which is an alignment control limit for conductive pads $112_2$ and $152_2$.

Figure 5B:
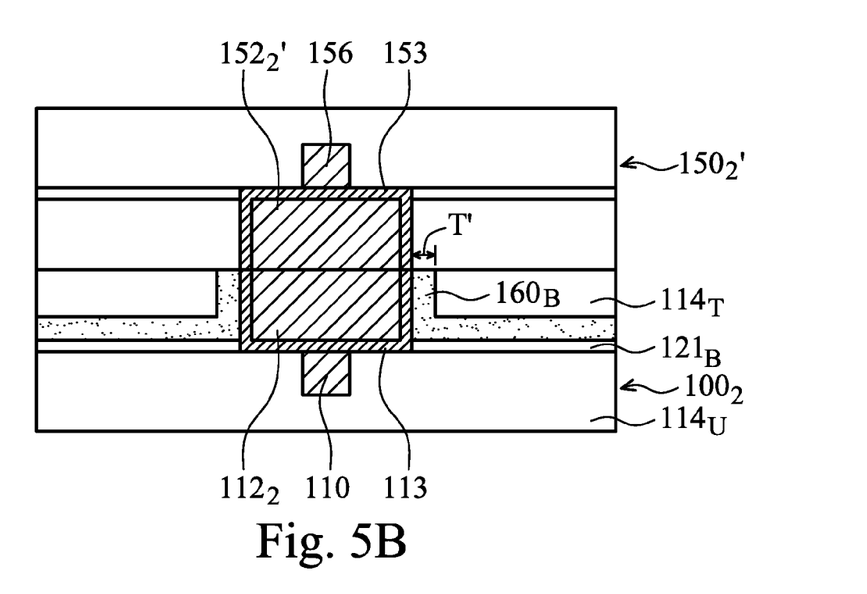

FIG. 5B shows a cross-sectional view of wafer $150_2'$ being bonded to wafer $100_2$, in accordance with some embodiments. FIG. 5B is similar to FIG. 5A with the exception that there is no diffusion barrier layer $160_T$ surrounding conductive pad $152_2'$. Diffusion barrier layer $160_B$ encircles and surrounds the conductive pad $112_2$. Diffusion barrier layer $160_B$ prevents copper diffusion resulting from mis-alignment of conductive pads $112_2$ and $152_2'$. The thickness T' of the diffusion barrier layer $160_E$ should be large enough to cover alignment variation. In some embodiments, the thickness T' is greater than about 0.01 μm, which is an alignment control limit for conductive pads $112_2$ and $152_2'$.

Figure 6A:
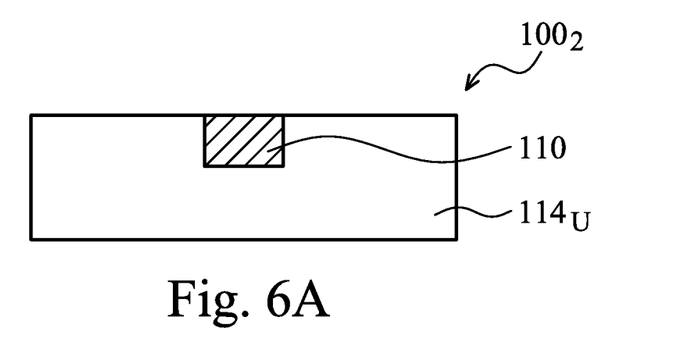
FIGS. 6A-6G show cross-sectional views of a sequential process flow for forming a diffusion barrier layer encircling a top portion of a conductive pad, in accordance with some embodiments.
Figure 6B:
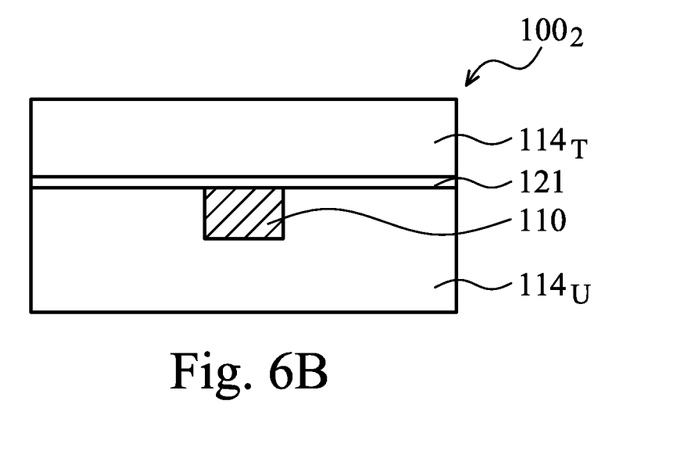

FIGS. 6A-6G show cross-sectional views of a sequential process flow for forming a diffusion barrier layer $160_B$ over the surface of wafer $100_2$ and encircling the top portion of the conductive pad $112_2$, in accordance with some embodiments. FIG. 6A shows a portion of wafer $100_2$ with a via 110, which is embedded in an insulating material $114_L$. After wafer $100_2$ of FIG. 6A is provided, an etch stop layer 121 and an insulating material (or layer) $114_T$ are sequentially deposited over the surface of wafer $100_2$, as shown in FIG. 6B in accordance with some embodiments.

Figure 6C:
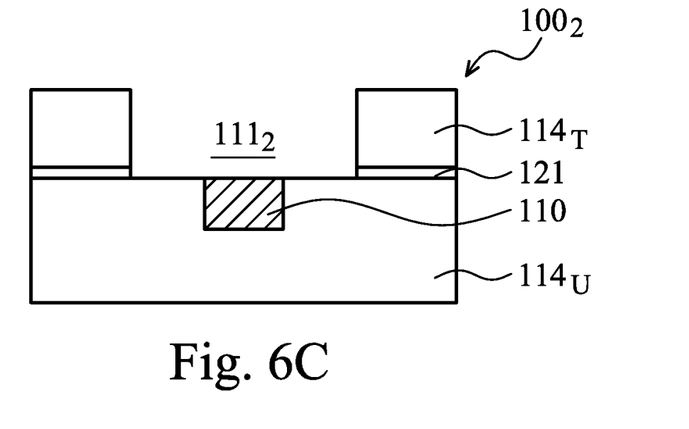
Figure 6D:
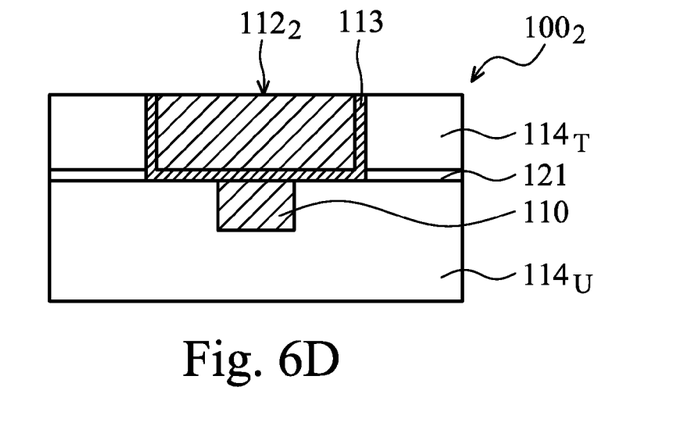

After the dielectric layers 121 and $114_T$ are deposited, wafer $100_2$ is patterned and etched to form opening $111_2$, as shown in FIG. 6C in accordance with some embodiments. Opening $111_2$ has a width $W_2$ in a range from about 0.1 μm to about 50 in accordance with some embodiments. Opening $111_2$ exposes the top of via 110. After opening $111_2$ is formed, a barrier layer 113 is deposited to line opening $111_2$ and a conductive material, such as copper or copper alloy, for conductive pad $112_2$ is deposited to fill opening $111_2$. A thin copper seed layer (not shown) may be deposited on the barrier layer 113 to assist the formation of the conductive material (layer) of conductive pad $112_2$. The copper-containing conductive material for pad $112_2$ is then deposited to fill opening $111_2$. The copper-containing conductive material and barrier layer 113 outside opening $111_2$ is then removed, as shown in FIG. 6D in accordance with some embodiments.

Figure 6E:
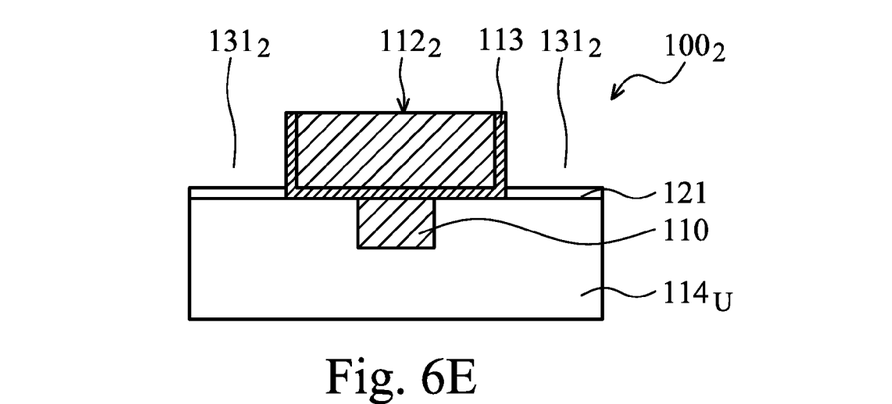

Afterwards, at least a portion of insulating material $114_T$ surrounding conductive pad $112_2$ is removed, as shown in FIG. 6E, in accordance with some embodiments. In some embodiments, the entire insulating material $114_T$ on wafer $100_2$ is removed. In some other embodiments, only the insulating material $114_T$ surrounding conductive pad $112_2$ is removed. The insulating material $114_T$ is removed by an etching process, which could be a dry process, such as a plasma etching process, or a wet etching process. In some embodiments, wafer $100_2$ is patterned to expose the areas of insulating material $114_T$ to be removed prior to the removal process to protect (or cover) conductive pad(s) $112_2$ and the portion of insulating material $114_T$ not intended to be removed. Openings $131_2$ are formed after the insulating material $114_T$ or insulating material surrounding conductive pas $112_2$ is removed, as shown in FIG. 6E, in accordance with some embodiments.

Figure 6F:
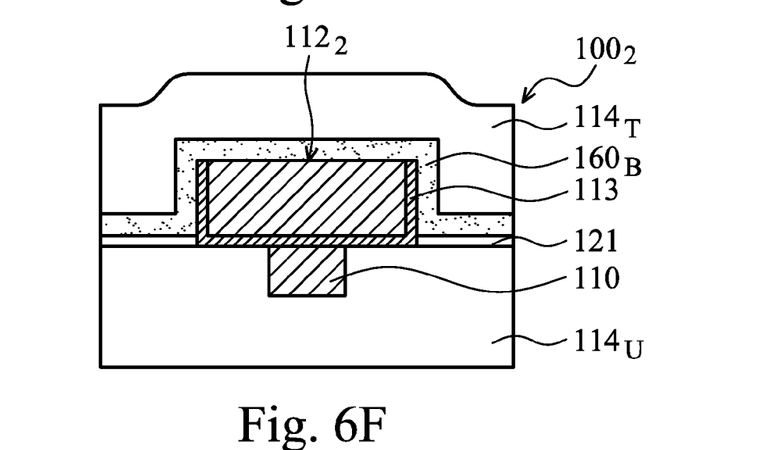

Afterwards, diffusion barrier layer $160_B$ and insulating material $114_T$ are deposited sequentially to fill openings $131_2$, as shown in FIG. 6F in accordance with some embodiments. The excess insulating material $114_T$ and diffusion barrier layer $160_T$ outside openings $131_2$ are moved, as shown in FIG. 6G in accordance with some embodiments.

Figures 6G, 7A:
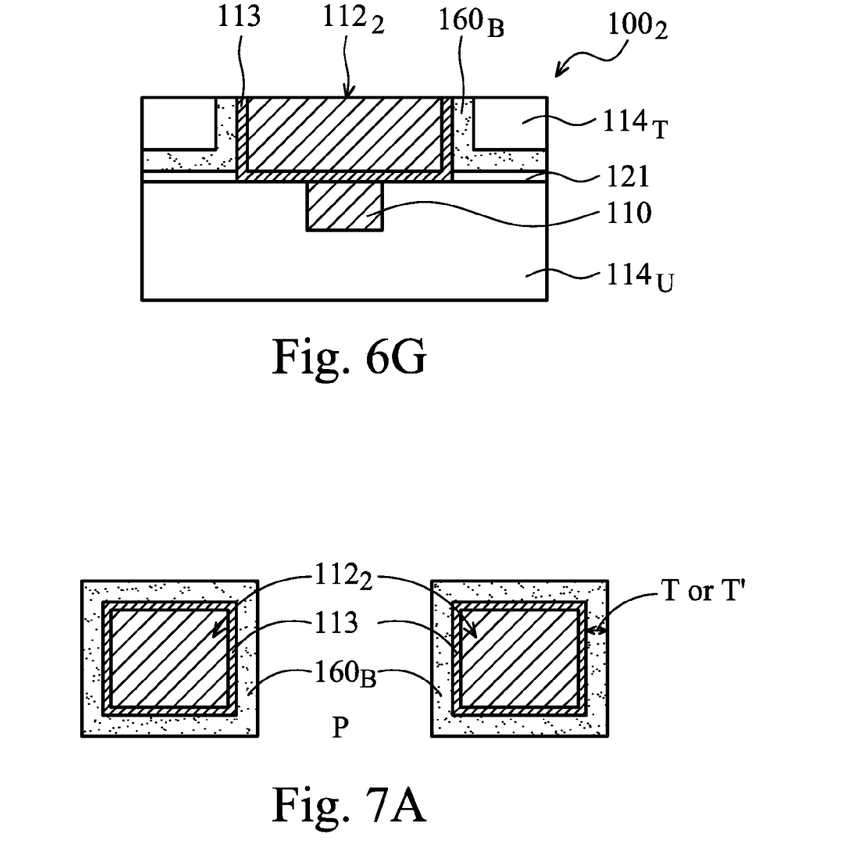
FIGS. 7A and 7B show top views of two neighboring conductive pads, in accordance with some embodiments.
Figure 7B:
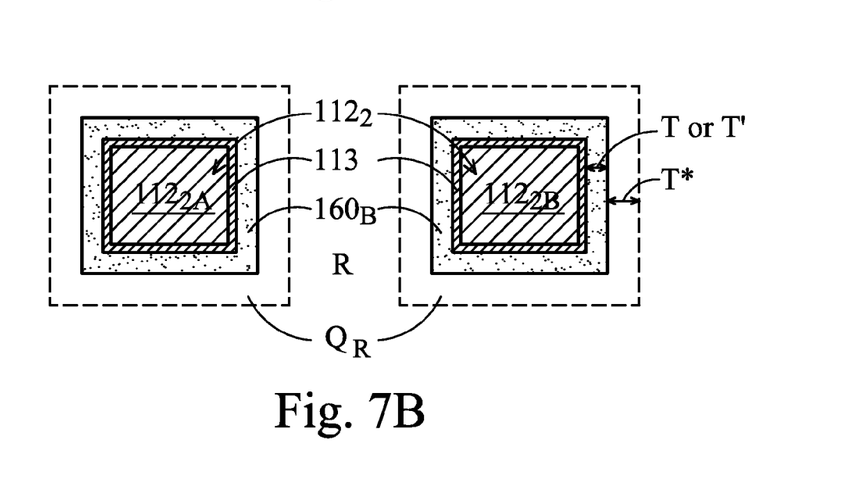

FIG. 7A shows a top view of two neighboring conductive pads $112_2$, in accordance with some embodiments. FIG. 7A shows that each conductive pad $112_2$ is surrounded by a barrier layer 113 and a ring of diffusion barrier layer $160_B$. The thickness of diffusion barrier layer $160_B$ is T or T', as described above in FIGS. 5A and 5B respectively. The areas surrounding diffusion barrier layer $160_B$, such as region "P", is made of insulating material $114_T$ with diffusion barrier layer $160_B$ underneath, as shown in FIG. 6G, in accordance with some embodiments. In some other embodiments, the diffusion barrier layer $160_B$ underneath the insulating material $114_T$ does not extend all the way to the next structure, such as to a neighboring conductive pad structure. FIG. 7B shows that the diffusion barrier layer $160_B$ surrounding conductive pad $112_{2A}$ only extend to region "Q", which does not connect to the diffusion barrier layer $160_B$ surrounding conductive pad $112_{2B}$, which also only extend to region "R", in accordance with some embodiments. The width of the diffusion barrier layer 160B under insulating material 114T is T*. In some embodiments, the width T* is in a range from about 0.001 μm to about 10 μm.

Figure 8A:
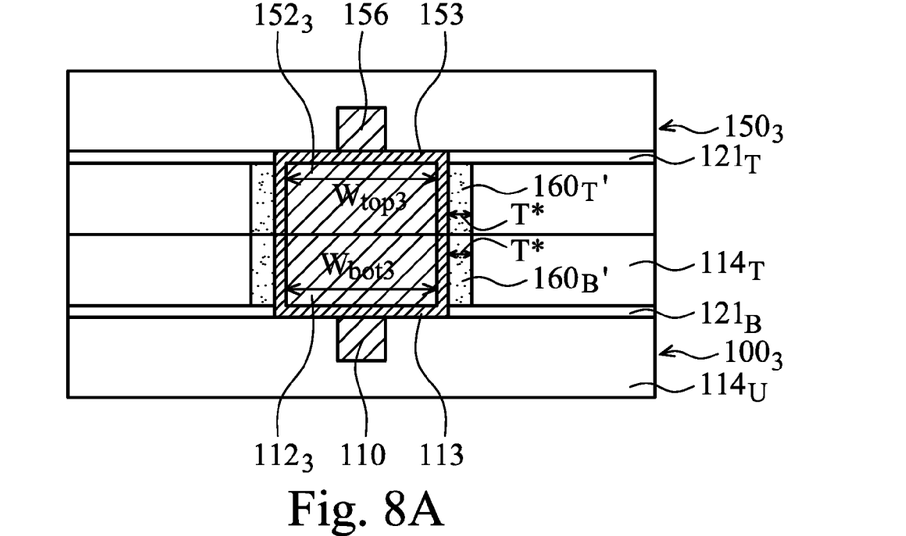
FIGS. 8A and 8B show cross-sectional views of two wafers bonded together, in accordance with some embodiments.

FIG. 8A shows a cross-sectional view of wafer $150_3$ being bonded to wafer $100_3$, in accordance with some embodiments. FIG. 8A shows the width $W_{top3}$ of conductive pad $152_3$ is about the same as the width $W_{bot3}$ of conductive pad $112_3$. Diffusion barrier layer $160_T'$ is formed on wafer $150_3$ and diffusion barrier layer $160_B'$ is formed on wafer $100_3$. Diffusion barrier layer $160_B'$ encircles and surrounds the conductive pad $112_3$. Diffusion barrier layer $160_T'$ also encircles and surrounds the conductive pad $152_3$. The diffusion barrier layers $160_T'$ and $160_B'$ are dielectric and may be made of a material(s) similar to diffusion barrier layer $160_1$.

Diffusion barrier layers $160_T'$ and $160_B'$ prevent copper diffusion resulting from mis-alignment of conductive pads $112_3$ and $152_3$. The thickness T* of the diffusion barrier layers $160_T'$ and $160_B'$ should be large enough to cover alignment variation. In some embodiments, the thickness T* is greater than about 0.01 μm, which is an alignment control limit for conductive pads $112_3$ and $152_3$. Diffusion barrier layers $160_T'$ and/or $160_B'$ can be a dielectric material or a conductive material. The conductive nature of diffusion barrier layers $160_T'$ and/or $160_B'$ would not cause shorting, as long as their widths are less than half of the distance between two neighboring conductive pads on the same substrate. As mentioned above, $160_T'$ and/or $160_B'$ may be made of materials, such as SiN, SiON, TaN, TiN, AlN, etc.

Figure 8B:
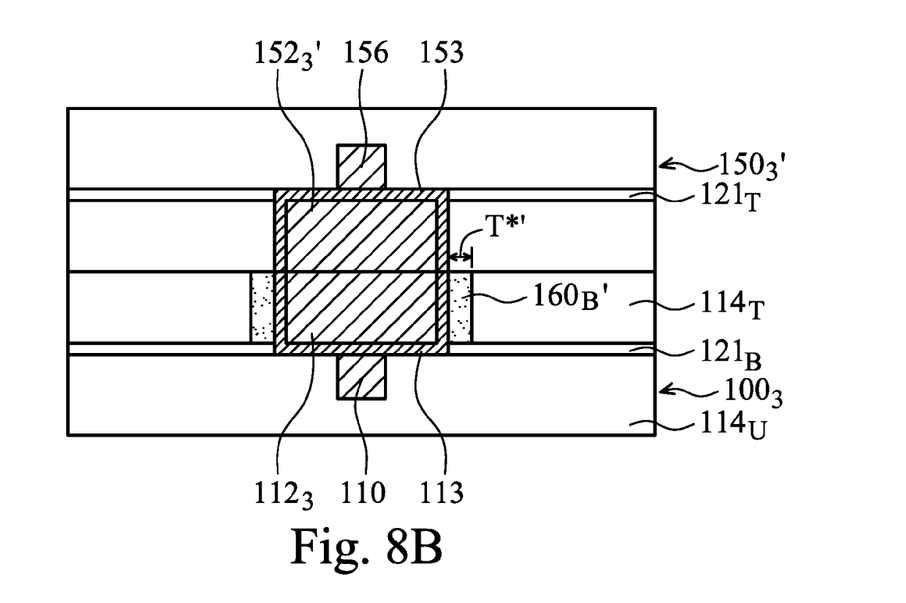

FIG. 8B shows a cross-sectional view of wafer $150_3'$ being bonded to wafer $100_3$, in accordance with some embodiments. FIG. 7B is similar to FIG. 7A with the exception that there is no diffusion barrier layer $160_T'$ surrounding conductive pad $152_3'$. Diffusion barrier layer $160_B'$ encircles and surrounds the conductive pad $112_3$. Diffusion barrier layer $160_B'$ prevents copper diffusion resulting from mis-alignment of conductive pads $112_3$ and $152_3'$. The thickness $T^{*\prime}$ of the diffusion barrier layer $160_B'$ should be large enough to cover alignment variation. In some embodiments, the thickness $T^{*\prime}$ is greater than about 0.01 μm, which is an alignment control limit for conductive pads $112_3$ and $152_3'$.

Figure 9A:
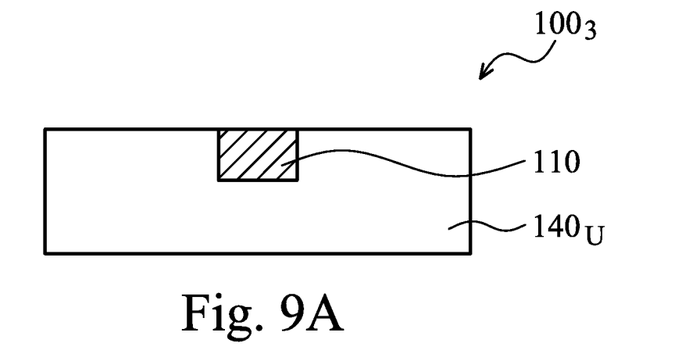
FIGS. 9A-9F show cross-sectional views of a sequential process flow for forming a diffusion barrier layer encircling a conductive pad, in accordance with some embodiments.
Figure 9B:
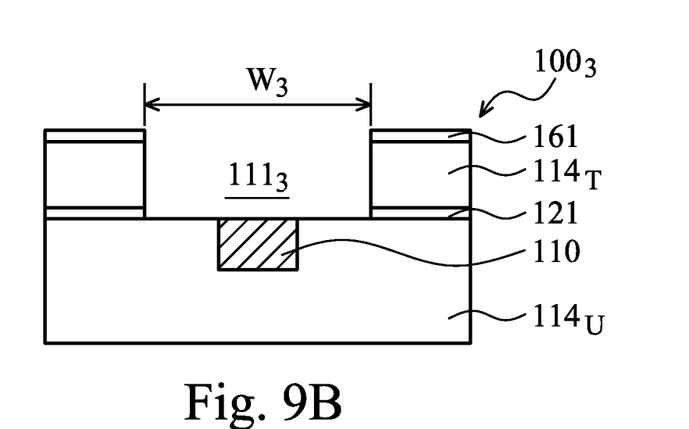
Figure 9C:
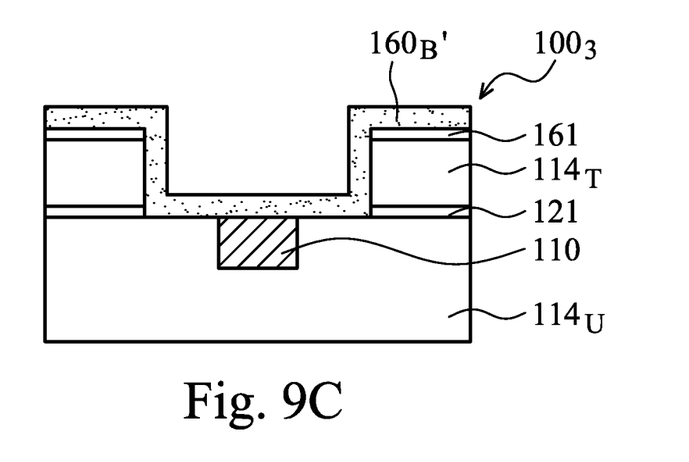

FIGS. 9A-9F show cross-sectional views of a sequential process flow for forming a diffusion barrier layer $160_B'$ encircling conductive pad $112_3$, in accordance with some embodiments. FIG. 9A shows a portion of wafer $100_3$ with a via 110, which is embedded in an insulating material $114_L$. After wafer $100_3$ of FIG. 9A is provided, an etch stop layer 121, an insulating material (or layer) $114_T$, and a planarization stop layer 161 are sequentially deposited over the surface of wafer $100_3$, as shown in FIG. 8B in accordance with some embodiments. The planarization layer is made of SiN or SiON with a thickness in a range from about 0.001 pm to about 50 in accordance with some embodiments. After these dielectric layers are deposited, wafer $100_3$ is patterned and etched to form opening $111_3$, also as shown in FIG. 8B in accordance with some embodiments. Opening $111_3$ has a width $W_3$ in a range from about 0.1 μm to about 50 μm, in accordance with some embodiments. Opening $111_3$ exposes the top of via 110. After opening $111_3$ is formed, a diffusion barrier layer $160_B'$ is deposited to cover the substrate surface and to line opening $111_3$, as shown in FIG. 9C in accordance with some embodiments. The thickness of the diffusion barrier layer $160_B'$ deposited is in a range from about 0.001 μm to about 10 μm, in accordance with some embodiments.

Figure 9D:
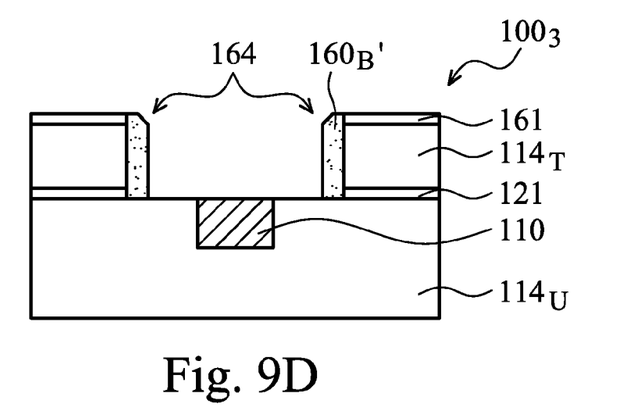
Figure 9E:
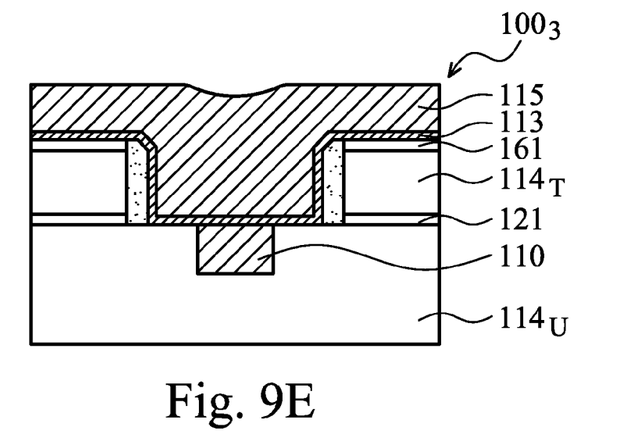
Figure 9F:
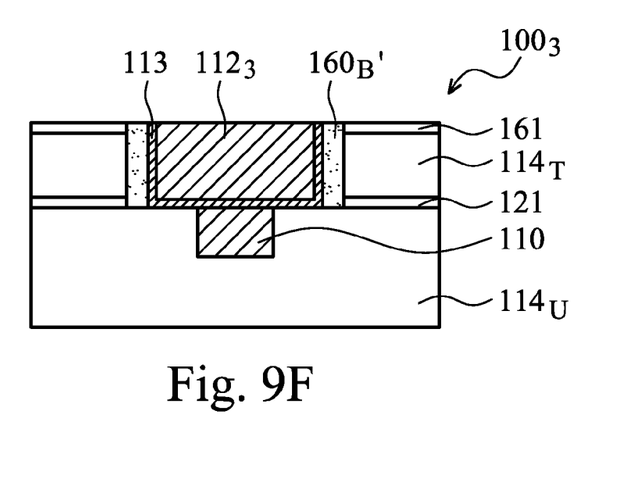

An etch process is performed afterwards to remove the diffusion barrier layer $160_B'$ on the surface of the wafer $100_3$ and also to taper the diffusion barrier layer $160_B'$ near corners 164, as shown in FIG. 9D in accordance with some embodiments. The tapered corners 164 make gap-fill of opening $111_3$ easier. Afterwards, barrier layer 113 and the conductive material 115 for the conductive pad $112_3$ are deposited sequentially to fill the remaining of opening $111_3$, as shown in FIG. 9E in accordance with some embodiment. A planarization process is then performed to remove the excess conductive material and barrier layer 113 outside opening $111_3$. The planarization layer 161 is used to prevent the underlying insulating material 114$_T$ from being removed excessively. After the excess conductive layers outside the opening 111$_3$ are removed, the exposed planarization layer 161 is removed, in accordance with some embodiments. FIG. 9F shows a cross-sectional view of conductive pad 112$_3$ with a diffusion barrier layer 160$_B$' formed next to and surrounding it, in accordance with some embodiments.

Figure 10A:
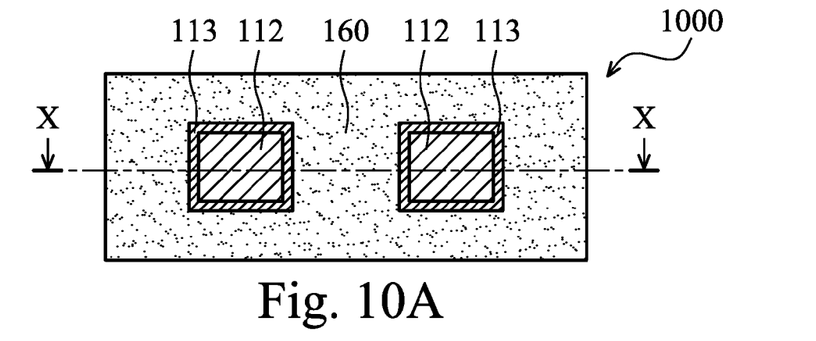
FIG. 10A shows a top view of a region of a wafer, in accordance with some embodiments.

FIG. 10A shows a top view of a region 1100 of a wafer 1000, in accordance with some embodiments. Region 1100 has two conductive pads 112, which are surrounded and encircled by a barrier layer 113 and a diffusion barrier layer 160. Diffusion barrier layer 160 is similar to diffusion barrier layer 160$_1$ described above and has the function of blocking copper diffusion. In some embodiments, diffusion barrier layer 160 is made of polymers, such as benzocyclobutene (BCB) polymer dielectric, which can block copper diffusion.

Figure 10B:
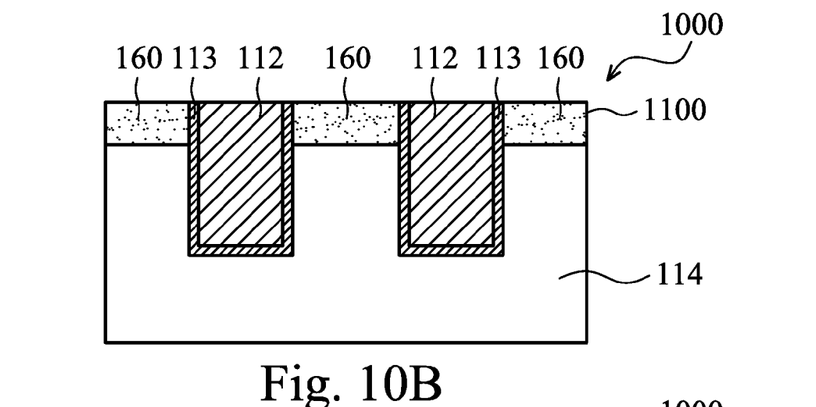
FIG. 10B shows a cross-sectional view of the region of the wafer in FIG. 10A, in accordance with some embodiments.

FIG. 10B shows a cross-sectional view of FIG. 10A cut along line XX, in accordance with some embodiments. FIG. 10B shows that conductive pads 112 are embedded in insulating material 114 and are surrounded by diffusion barrier layer 160 near the surface of wafer 1000. In some embodiments, the diffusion barrier layer 160 is originally in liquid form and is deposited by a spin-on process. The liquid-form material of diffusion barrier layer 160 undergoes polymerization to become solid-form diffusion barrier layer 160. In some embodiments, solvent of the liquid-form material of diffusion barrier layer 160 evaporates in the process of forming the solid-form diffusion barrier layer 160.

Figure 10C:
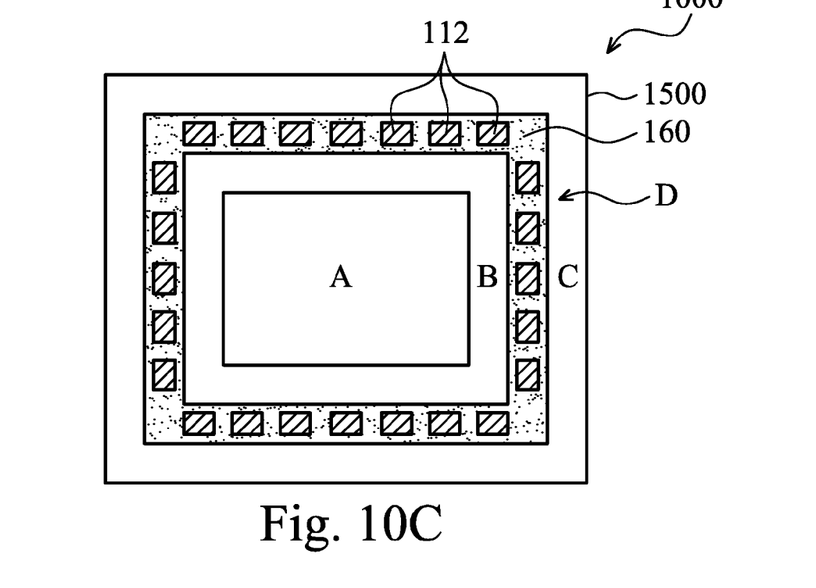
FIG. 10C shows a top view of a region of the wafer in FIGS. 10A and 10B, in accordance with some embodiments.

FIG. 10C shows a top view of a region 1500 of wafer 1000, in accordance with some embodiments. FIG. 10C shows that the diffusion barrier layer 160 forms a band-region D surrounding conductive pads 112 that encircle a device region A. In some embodiments, region A has an array of photo sensors (or pixels). Region A is surrounded by a region B, which is made of oxide (SiO$_2$), in accordance with some embodiments. Region C that surrounds the band-region D is also made of oxide, in accordance with some embodiments. In some embodiments, the band-region D surrounding region A follows the shape of region A. In the embodiment shown in FIG. 10C, the band-region D has a shape of rectangular band-shape. Wafer 1000 is bonded to another wafer with an identical arrangement of conductive pads, diffusion barrier layer 160 and photo sensors, in accordance with some embodiments.

The conductive pads 112 shown above in FIGS. 7A, 7B, and 10A are in square and/or rectangular shapes. According to other embodiments, the conductive pads 112 are in other applicable shapes, such as circular, oval, etc.

The embodiments of diffusion barrier layer described above provide mechanisms of forming a copper diffusion barrier layer to prevent device degradation for hybrid bonding of wafers. The diffusion barrier layer(s) encircles the copper-containing conductive pads used for hybrid bonding. The diffusion barrier layer can be on one of the two bonding wafers or on both bonding wafers.

In accordance with one embodiment, a semiconductor substrate is provided. The semiconductor substrate includes a conductive pad formed in and near a surface the semiconductor substrate, and a surface of the conductive pad is exposed. The surface of the conductive pad is to be used for hybrid-bonding with another conductive pad of another substrate. The semiconductor substrate also includes a first barrier layer lining the conductive pad, and a second barrier layer surrounding the conductive pad. A surface of the second barrier layer is aligned with the surface of the conductive pad.

In accordance with another embodiment, a hybrid-bonded structure is provided. The hybrid-bonded structure includes a first conductive pad of a first substrate bonded to a second conductive pad of a second substrate. the first conductive pad is separated from the remaining of the first substrate by a first diffusion barrier layer. The second conductive pad is separated from the remaining of the second substrate by a second diffusion barrier layer. The hybrid-bonded structure also includes a first dielectric region of the first substrate bonded to a second dielectric region of the second substrate. The hybrid-bonded structure further includes a third diffusion barrier layer of the first substrate bonded to a third dielectric region of the second substrate. The third diffusion barrier layer surrounds the first conductive pad.

In accordance with another embodiment, a method of forming a diffusion barrier layer of a substrate for hybrid bonding is provided. The method includes providing the substrate with a conductive structure, and depositing an etch stop layer over surface of the substrate. The etch stop layer comes in contact with the conductive structure. The method also includes depositing a dielectric material over the etch stop layer, and depositing the diffusion barrier layer over the dielectric material. The method further includes forming a conductive pad embedded in the sequentially deposited etch stop layer, dielectric material, and diffusion barrier layer. A surface of the diffusion barrier layer is aligned with a surface of the conductive pad.

In accordance with yet another embodiment, a method of forming a diffusion barrier layer of a substrate for hybrid bonding is provided. The method includes providing the substrate with a conductive structure, and depositing a dielectric material over an etch stop layer. The method also includes patterning the substrate to form an opening in the dielectric material, and the opening exposes the conductive structure. The method further includes depositing a first diffusion barrier layer to line the opening, and etching a portion of the first diffusion barrier layer outside the opening and at a bottom surface of the opening is removed. The etching exposes the conductive structure, and a remaining portion of the first diffusion barrier layer covers sidewalls of the opening. In addition, the method includes depositing a second diffusion barrier layer after the etching, and the second diffusion barrier layer covers exposed surfaces of the remaining portion of the first diffusion barrier layer. Additionally, the method includes depositing a conductive material to fill space in the opening, and removing conductive material and the second diffusion barrier layer outside the opening by a planarization process to form a conductive pad with the first diffusion barrier layer surrounding the second diffusion barrier layer and the conductive pad.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor substrate, comprising:
    a conductive pad formed in and near a surface of the semiconductor substrate, wherein a surface of the conductive pad is exposed, and wherein the surface of the conductive pad usable for hybrid-bonding with another conductive pad of another substrate;
    a first barrier layer lining the conductive pad, wherein the first barrier layer separates a bottom surface of the conductive pad from the semiconductor substrate;
    a second barrier layer surrounding the conductive pad, wherein a surface of the second barrier layer is aligned with the surface of the conductive pad, and a thickness of the second barrier layer is greater than about 0.01 microns (μm); and
    an insulating material over the semiconductor substrate, wherein the second barrier layer is between the semiconductor substrate and the insulating material, and the insulating material is usable for hybrid-bonding with another insulating material of another substrate.

2. The semiconductor substrate of claim 1, wherein the surface of the second barrier layer extends across the surface of the semiconductor substrate.

3. The semiconductor substrate of claim 1, wherein the second barrier layer forms a ring around the conductive pad.

4. The semiconductor substrate of claim 3, wherein the ring has a width in a range from about 0.1μm to about 50μm.

5. The semiconductor substrate of claim 1, wherein the conductive pad contains copper.

6. The semiconductor substrate of claim 1, wherein the first barrier layer is conductive.

7. The semiconductor substrate of claim 1, wherein the second barrier layer is a dielectric material.

8. The semiconductor substrate of claim 1, wherein the second barrier layer is made of SiN or SiON.

9. The semiconductor substrate of claim 3, wherein the second barrier layer is a conductive material.

10. The semiconductor substrate of claim 9, wherein the second barrier layer includes TaN, TiN, or AN.

11. A hybrid-bonded structure, comprising:
    a first conductive pad of a first substrate bonded to a second conductive pad of a second substrate, wherein a surface of the first conductive pad opposite a surface of the first conductive pad bonded to the second conductive pad is separated from a top surface of the first substrate by a first diffusion barrier layer, and wherein the second conductive pad is separated from a remaining portion of the second substrate by a second diffusion barrier layer;
    a first dielectric region of the first substrate bonded to a second dielectric region of the second substrate;
    a third diffusion barrier layer of the first substrate bonded to a third dielectric region of the second substrate, wherein the third diffusion barrier layer surrounds the first conductive pad; and the third diffusion barrier layer has a thickness greater than about 0.01 microns (μm).

12. The hybrid-bonded structure of claim 11, wherein a surface of the third diffusion barrier layer bonded to the third dielectric region is aligned with a surface of the first conductive pad bonded to the second conductive pad.

13. A hybrid-bonded structure, comprising:
    a first wafer, the first wafer comprising:
        a first conductive pad,
        a first barrier layer, wherein a bottom surface of the first conductive pad is separated from a top surface of the first wafer by the first barrier layer,
        a first dielectric region, and
        a first diffusion barrier layer surrounding the first conductive pad, wherein the first diffusion barrier separates the first conductive pad from the first dielectric region, the first diffusion barrier layer has a thickness greater than about 0.01 microns (μm), and separates the first dielectric region from the first wafer; and
    a second wafer bonded to the first wafer, the second wafer comprising:
        a second conductive pad,
        a second barrier layer, wherein the second conductive pad of the second wafer is separated from a portion of the second wafer by the second barrier layer, and
        a second dielectric region, wherein the second dielectric region is bonded to the first dielectric region.

14. The hybrid-bonded structure of claim 13, wherein the second wafer further comprises a second diffusion barrier layer surrounding the second conductive pad.

15. The hybrid-bonded structure of claim 14, wherein the second diffusion barrier layer is in contact with the first diffusion barrier layer.

16. The hybrid-bonded structure of claim 13, wherein the first wafer further comprises a via, wherein the first barrier layer is between the first conductive pad and the via.

17. The hybrid-bonded structure of claim 13, wherein the first diffusion barrier layer comprises a polymer.

* * * * *